(12) United States Patent
Vijayrao et al.

(10) Patent No.: US 11,880,263 B2
(45) Date of Patent: Jan. 23, 2024

(54) SYSTEMS HAVING DISAGGREGATED COMPONENTS COUPLED BY OPTICAL MEDIA

(71) Applicant: Meta Platforms, Inc., Menlo Park, CA (US)

(72) Inventors: Narsing Krishna Vijayrao, Santa Clara, CA (US); Pallab Bhattacharya, San Jose, CA (US)

(73) Assignee: Meta Platforms, Inc., Menlo Park, CA (US)

( * ) Notice: Subject to any disclaimer, the term of this patent is extended or adjusted under 35 U.S.C. 154(b) by 211 days.

(21) Appl. No.: 17/319,376

(22) Filed: May 13, 2021

(65) Prior Publication Data

US 2022/0365583 A1 Nov. 17, 2022

(51) Int. Cl.

| | | |
|---|---|---|
| *G06F 1/329* | (2019.01) | |
| *G02B 6/12* | (2006.01) | |
| *G06F 12/02* | (2006.01) | |
| *G11C 7/10* | (2006.01) | |
| *G11C 5/06* | (2006.01) | |
| *G11C 5/02* | (2006.01) | |
| *G11C 11/42* | (2006.01) | |

(52) U.S. Cl.
CPC ............... *G06F 1/329* (2013.01); *G02B 6/12* (2013.01); *G06F 12/0246* (2013.01); *G11C 7/1054* (2013.01); *G11C 5/025* (2013.01); *G11C 5/066* (2013.01); *G11C 7/1081* (2013.01); *G11C 11/42* (2013.01)

(58) Field of Classification Search
CPC ....... G02B 6/12; G06F 1/329; G06F 12/0246; G11C 11/42; G11C 5/025; G11C 5/066; G11C 7/1054; G11C 7/1081
See application file for complete search history.

(56) References Cited

U.S. PATENT DOCUMENTS

| | | |
|---|---|---|
| 7,505,822 B2 | 3/2009 | Vishkin |
| 9,390,016 B2 | 7/2016 | Koka et al. |
| 9,632,784 B2 | 4/2017 | Julier et al. |
| 11,113,232 B2* | 9/2021 | Joshi .................... H05K 5/0069 |
| 2008/0077731 A1 | 3/2008 | Forrest et al. |
| 2012/0033978 A1* | 2/2012 | Morris .................. G06F 13/409 |
| | | 398/115 |
| 2013/0308942 A1 | 11/2013 | Ji et al. |
| 2019/0384367 A1 | 12/2019 | Jain et al. |
| 2019/0385994 A1* | 12/2019 | Rifani ..................... H01L 23/32 |

(Continued)

OTHER PUBLICATIONS

International Search Report and Written Opinion for International Application No. PCT/US2022/028818, dated Aug. 23, 2022, 9 pages.

(Continued)

*Primary Examiner* — Terrell S Johnson
(74) *Attorney, Agent, or Firm* — Greenberg Traurig, LLP

(57) ABSTRACT

A disclosed system may include (1) a memory package having a physical memory and optical circuitry, (2) a processor package, separate and distinct from the memory package, having at least one physical processor and additional optical circuitry, and (3) an optical medium communicatively coupling the optical circuitry of the memory package with the additional optical circuitry of the processor package. Various other systems, apparatuses, and methods are also disclosed.

20 Claims, 13 Drawing Sheets

(56) References Cited

U.S. PATENT DOCUMENTS

2020/0132930 A1   4/2020  Bchir
2021/0118853 A1*  4/2021  Harris ..................... G11C 5/04

OTHER PUBLICATIONS

Andani; Suresh, "Enabling Chiplet And Co-Packaged OpticsArchitectures With 112G XSR SerDes", URL: https://semiengineering.com/enabling-chiplet-and-co-packaged-optics-architectures-with-112g-xsr-serdes/, May 14, 2020, pp. 1-6.
International Preliminary Report on Patentability for International Application No. PCT/US2022/028818, dated Nov. 23, 2023, 8 pages.

* cited by examiner

SYSTEMS HAVING DISAGGREGATED COMPONENTS COUPLED BY OPTICAL MEDIA

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
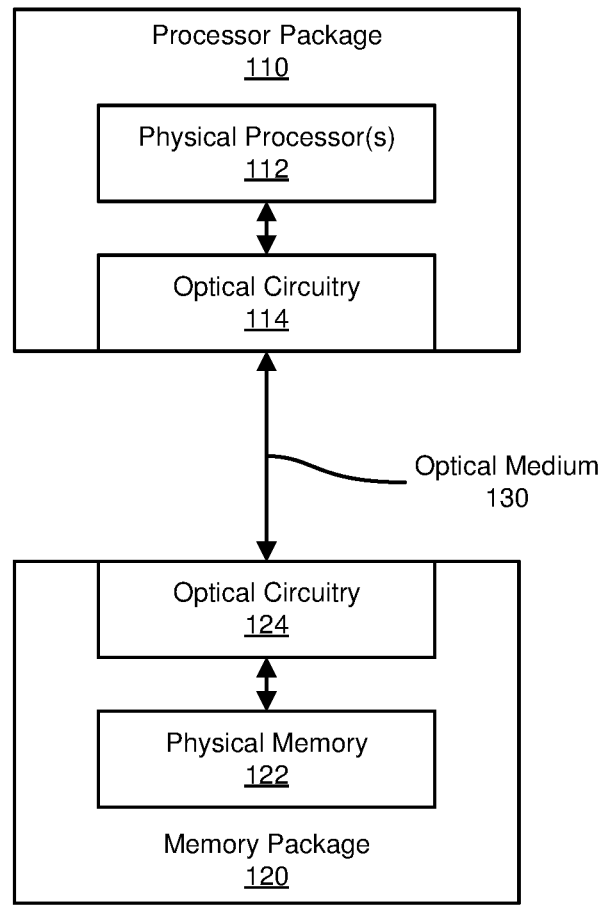
FIG. 1 is a block diagram of an exemplary disaggregated computing system having a processor package and a memory package optically coupled by an optical medium.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

Traditionally, designers of conventional general-purpose processors have included physical processors and physical memory (e.g., caches) in the same semiconductor dies or Integrated-Circuit (IC) packages in an attempt to improve associated latencies and bandwidths. Today, the demand for handling complex computational and/or memory intensive workloads (such as those involved in Artificial Intelligence (AI), Machine Learning (ML), analytics, and video/image processing) is expanding at an ever-increasing rate. In an attempt to further improve latencies and bandwidths for today's computational and/or memory intensive workloads, designers of conventional general-purpose processors are integrating more and more functionalities and resources into monolithic dies (e.g., as a System on a Chip (SoC)) or monolithic IC packages (e.g., as a System in a Package (SiP), a Multi-Chip Module (MCM), or a Three-Dimensional Integrated Circuit (3D IC)).

Unfortunately, designers of conventional general-purpose processors are encountering various scalability, cooling, power, performance, and/or area limitations resulting from integrating so many components into a single die and/or IC package. For example, designers are increasingly unable to pack more compute units into a single silicon die because of the yield-affecting complexities related to connecting the compute units' various sub-units such as cache units to Arithmetic Logic Units (ALUs). Another common side effect encountered by designers of conventional general-purpose processors is an increased inability to apply proper and efficient cooling to the components that need it. As a result of uneven heating, conventional monolithic IC packages may experience various damaging effects such as shearing amongst their various layers.

End users are also encountering limitations caused by today's computing systems being contained in monolithic dies and/or IC packages. For example, end users of conventional general-purpose processors are increasingly unable to individually provision their computing systems to efficiently process their unique workloads. Instead, end users are often required to conform the processing of their workloads to a limited number of available general-purpose processors that have fixed ratios of compute, memory, and other resources. When end users conform computational or memory intensive workloads to a conventional general-purpose processor, some portion of the general-purpose processor's compute or memory resources may be wasted. Additionally, while some of today's monolithic IC packages may integrate most if not all of the necessary components of a computer or other electronic system, end users are generally unable to replace, upgrade, or reconfigure components to suit their individual needs and requirements. Accordingly, the instant disclosure identifies and addresses a need for additional and improved systems and methods for enabling low-latency, high-bandwidth computing systems that are easily configured, optimized, upgraded, and/or reconfigured.

The present disclosure is generally directed to using optical circuitry (e.g., optical-lets or optical chiplets) to disaggregate the physical processors, physical memory (e.g., Static Randomly Addressable Memory (SRAM) and/or High Bandwidth Memory (HBM)), coprocessors, controllers, and other system components (such as those found integrated in conventional monolithic SoCs, SiPs, MCMs, and 3D ICs) into separate and distinct IC packages that can be independently optimized, scaled, powered, and/or cooled. Embodiments of the present disclosure may enable end users to provision computing systems with resource ratios, such as the ratio of compute and memory resources, that meet their individual requirements.

By using optical transports instead of electrical transports, the disclosed systems may have improved data transport latencies and bandwidths compared to today's monolithic designs. Moreover, by using optical-based communications, rather than electrical-based communications, the disclosed systems may enable data to be moved between IC packages across relatively large distances without incurring latency or bandwidth penalties and without a loss of data integrity. In some embodiments, the disclosed processor, memory, coprocessor, and/or resource-managing packages may be disaggregated at a board or rack level, which may enable simple and/or targeted power and cooling solutions.

Features from any of the embodiments described herein may be used in combination with one another in accordance with the general principles described herein. These and other embodiments, features, and advantages will be more fully understood upon reading the following detailed description in conjunction with the accompanying drawings and claims.

The following will provide, with reference to FIGS. 1-12, detailed descriptions of exemplary apparatuses, systems, configurations, and/or implementations for optically disaggregating processor, memory, coprocessor, and/or resource-managing components and functionalities. In addition, the discussion corresponding to FIG. 13 will provide a detailed description of an exemplary method for utilizing disaggregated IC packages in computing and memory systems.

FIG. 1 illustrates an exemplary disaggregated computing system 100 that includes a processor package 110 and a memory package 120 coupled by an optical medium 130. As shown, processor package 110 may include one or more physical processor(s) 112 electrically or optically coupled to co-packaged optical circuitry 114, and memory package 120 may include physical memory 122 electrically or optically coupled to co-packaged optical circuitry 124.

As used herein, the term "physical processor" may refer to any type or form of hardware-implemented processing unit capable of interpreting and/or executing computer-readable instructions. Examples of physical processors include, without limitation, microprocessors, microcontrollers, Central Processing Units (CPUs), Graphics Processing Units (GPUs), Digital Signal Processors (DSPs), Field-Programmable Gate Arrays (FPGAs), Application-Specific Integrated Circuits (ASICs), portions of one or more of the same, variations or combinations of one or more of the same, or any other suitable physical processor.

As used herein, the term "physical memory" may refer to any type or form of volatile or non-volatile storage device or medium capable of storing data and/or computer-readable instructions. Examples of memory devices include, without limitation, Random Access Memory (RAM), Read Only Memory (ROM), Dynamic Randomly Addressable Memory (DRAM), embedded DRAM (eDRAM), Static Randomly Addressable Memory (SRAM), High Bandwidth Memory (HBM), flash memory, Hard Disk Drives (HDDs), Solid-State Drives (SSDs), optical disk drives, caches such as instruction caches, data caches, and/or translation lookaside buffers, variations or combinations of one or more of the same, or any other suitable form of data storage. In some embodiments, the term physical memory may refer to a level-1 cache, a primary cache, a level-2 cache, a level-3 cache, and/or any other level of hardware cache.

As used herein, the term "optical circuitry" may refer to any type or form of functional circuitry and/or interface capable of producing, detecting, controlling, modulating, or modifying electromagnetic waves carrying optical data via an optical medium (e.g., a fiber-optic cable, an optical link, or an optical waveguide). Examples of optical circuitry include, without limitation, electro-optic circuitry, optical transmitters, optical receivers, semiconductor photodetectors, silicon photonic circuitry, electro-optic modulators, microring resonator electro-optic modulators, directly-modulated lasers, photonic integrated circuits (PICs), integrated optical circuits, semiconductor-based laser diodes, vertical-cavity surface-emitting lasers (VCSELs), optical Serializer/Deserializers, electrical Serializer/Deserializers, optical modulators, arrayed waveguide gratings (AWG), variations or combinations of one or more of the same, or any other suitable optical interconnect that enables transmission of optical data.

In some embodiments, some or all of the disclosed optical circuitries may be communication-protocol agnostic and/or generalized to relay communications of multiple known protocols. For example, the disclosed optical circuitries may be capable of relaying messages a Peripheral Component Interconnect Express (PCIe) communication protocol, messages of a Compute Express Link (CXL) communication protocol, messages of a Double Data Rate (DDR) communication protocol, messages of a High Bandwidth Memory (HBM) communication protocol, and/or messages of the communication protocols of any of the other resources described herein.

As used herein, the term "package" may refer to any housing or substrate that includes or contains one or more semiconductor dies, chiplets, or ICs. In some embodiments, a package may include and/or represent a single die attached and/or soldered to a substrate. In other embodiments, a package may include and/or represent multiple dies or chiplets attached and/or soldered to a substrate. The multiple dies or chiplets may be electrically or optically coupled using suitable die-to-die interconnects (e.g., a Bunch-of-Wires (BoW) interface or Serializer/Deserializer (SerDes) links such as extra short reach (XSR) SerDes links). The disclosed IC packages may be constructed using any suitable IC packaging techniques including, but not limited to, 2.5D packaging techniques, 3D packaging techniques, chiplet packaging techniques, and fan-out packaging techniques.

As used herein, the term "optical medium" may refer to any type or form of package-to-package optical interconnect or communication channel capable of propagating electromagnetic waves. Examples of optical media include, without limitation, fiber-optic cables and optical waveguides. In some embodiments, an optical medium may be detachable. Alternatively, an optical medium may be permanently affixed (e.g., during manufacture) to a package's optical circuitry.

In some embodiments, the disclosed optical media may have lengths in the range of centimeters (cm), tens of centimeters, meters (m), tens of meters, or more. For example, the disclosed optical media may have lengths sufficient to span system boards and/or data-center racks. In at least one embodiment, the disclosed optical media may form an optical backplane capable of optically coupling disaggregated packages in one rack-mounted chassis with disaggregated packages in other rack-mounted chassis.

In some embodiments, the disclosed optical media may have lengths within the range of 1 cm-5 cm, 5 cm-10 cm, 10 cm-15 cm, 15 cm-20 cm, 20 cm-25 cm, 25 cm-30 cm, 30 cm-35 cm, 35 cm-40 cm, 40 cm-45 cm, 45 cm-50 cm, 50 cm-55 cm, 55 cm-60 cm, 60 cm-65 cm, 65 cm-70 cm, 70 cm-75 cm, 75 cm-80 cm, 80 cm-85 cm, 85 cm-90 cm, 90 cm-95 cm, 95 cm-100 cm, 100 cm-105 cm, 105 cm-110 cm, 110 cm-115 cm, 115 cm-120 cm, 120 cm-125 cm, 125 cm-130 cm, 130 cm-135 cm, 135 cm-140 cm, 140 cm-145 cm, 145 cm-150 cm, 160 cm-165 cm, 165 cm-170 cm, 170 cm-175 cm, 175 cm-180 cm, 180 cm-185 cm, 185 cm-190 cm, 190 cm-195 cm, 195 cm-200 cm, 200 cm-205 cm, 205 cm-210 cm, 210 cm-215 cm, 215 cm-220 cm, 220 cm-225 cm, 225 cm-230 cm, 230 cm-235 cm, 235 cm-240 cm, 240 cm-245 cm, 245 cm-250 cm, 260 cm-265 cm, 265 cm-270 cm, 270 cm-275 cm, 275 cm-280 cm, 280 cm-285 cm, 285 cm-290 cm, 290 cm-295 cm, 295 cm-300 cm, 300 cm, 300 cm-305 cm, 305 cm-310 cm, 310 cm-315 cm, 315 cm-320 cm, 320 cm-325 cm, 325 cm-330 cm, 330 cm-335 cm, 335 cm-340 cm, 340 cm-345 cm, 345 cm-350 cm, 360 cm-365 cm, 365 cm-370 cm, 370 cm-375 cm, 375 cm-380 cm, 380 cm-385 cm, 385 cm-390 cm, 390 cm-395 cm, 395 cm-400 cm, 400 cm, 400 cm-405 cm, 405 cm-410 cm, 410 cm-415 cm, 415 cm-420 cm, 420 cm-425 cm, 425 cm-430 cm, 430 cm-435 cm, 435 cm-440 cm, 440 cm-445 cm, 445 cm-450 cm, 460 cm-465 cm, 465 cm-470 cm, 470 cm-475 cm, 475 cm-480 cm, 480 cm-485 cm, 485 cm-490 cm, 490 cm-495 cm, or 495 cm-500 cm.

Figure 2:
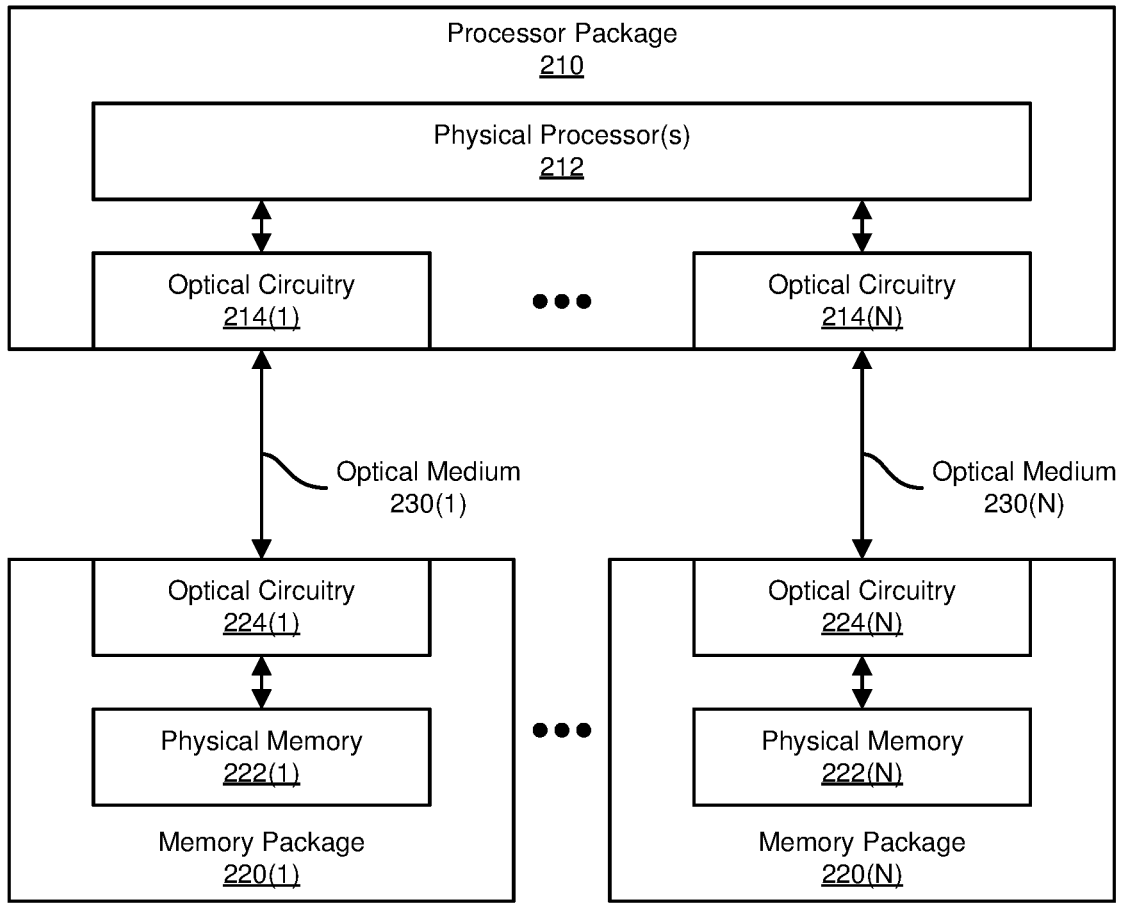
FIG. 2 is a block diagram of an exemplary disaggregated computing system having a processor package optically coupled to multiple memory packages by optical media.

FIG. 2 illustrates an exemplary disaggregated computing system 200 that includes a processor package 210 coupled to multiple memory packages 220(1)-(N) by optical media 230(1)-(N). As shown, each of optical media 230(1)-(N) may couple one of memory packages 220(1)-(N) to processor package 210. In this example, processor package 210 may include one or more physical processor(s) 212 each being electrically or optically coupled to co-packaged optical circuitries 214(1)-(N), and each of memory packages 220(1)-(N) may include a physical memory 222 electrically or optically coupled to co-packaged optical circuitry 224.

In some examples, system 200 may enable an end user to easily scale and/or reconfigure system 200 to suit the end user's individual requirements by coupling additional and/or different memory packages to processor package 210. For example, an end user needing a particular amount of HBM may simply couple as many HBM containing memory packages to processor package 210 as satisfies the need. Similarly, an end user needing a particular amount of cache memory may simply couple as many cache containing memory packages to processor package 210 as needed. If an end user later requires more or less HBM or cache memory, the user may add or remove memory packages to best utilize and/or conserve memory resources.

Figure 3:
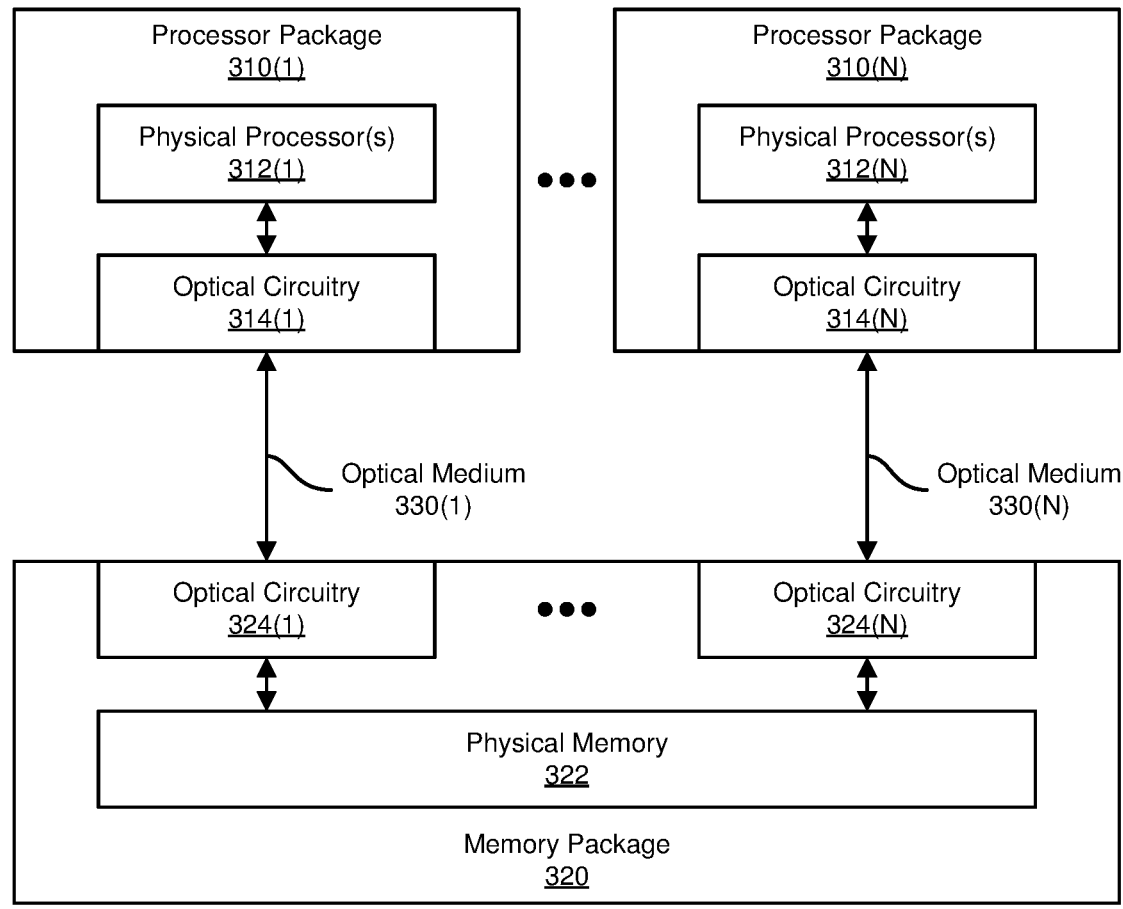
FIG. 3 is a block diagram of an exemplary disaggregated computing system having multiple processor packages optically coupled to a memory package by optical media.

FIG. 3 illustrates an exemplary shared-memory system 300 that includes multiple processor packages 310(1)-(N) sharing access to a memory package 320 via optical media 330(1)-(N), respectively. As shown, each of processor packages 310(1)-(N) may include one or more physical processor(s) 312 electrically or optically coupled to co-packaged optical circuitry 314, and memory package 320 may include physical memory 322 electrically or optically coupled to co-packaged optical circuitry 324(1)-(N). In some examples, system 300 may enable an end user to easily scale and/or reconfigure system 300 to suit the end user's individual requirements by coupling additional and/or different processor packages to memory package 320. In some embodiments, physical memory 322 may be sized to fit a particular dataset in order to eliminate a need for sharding.

Figure 4:
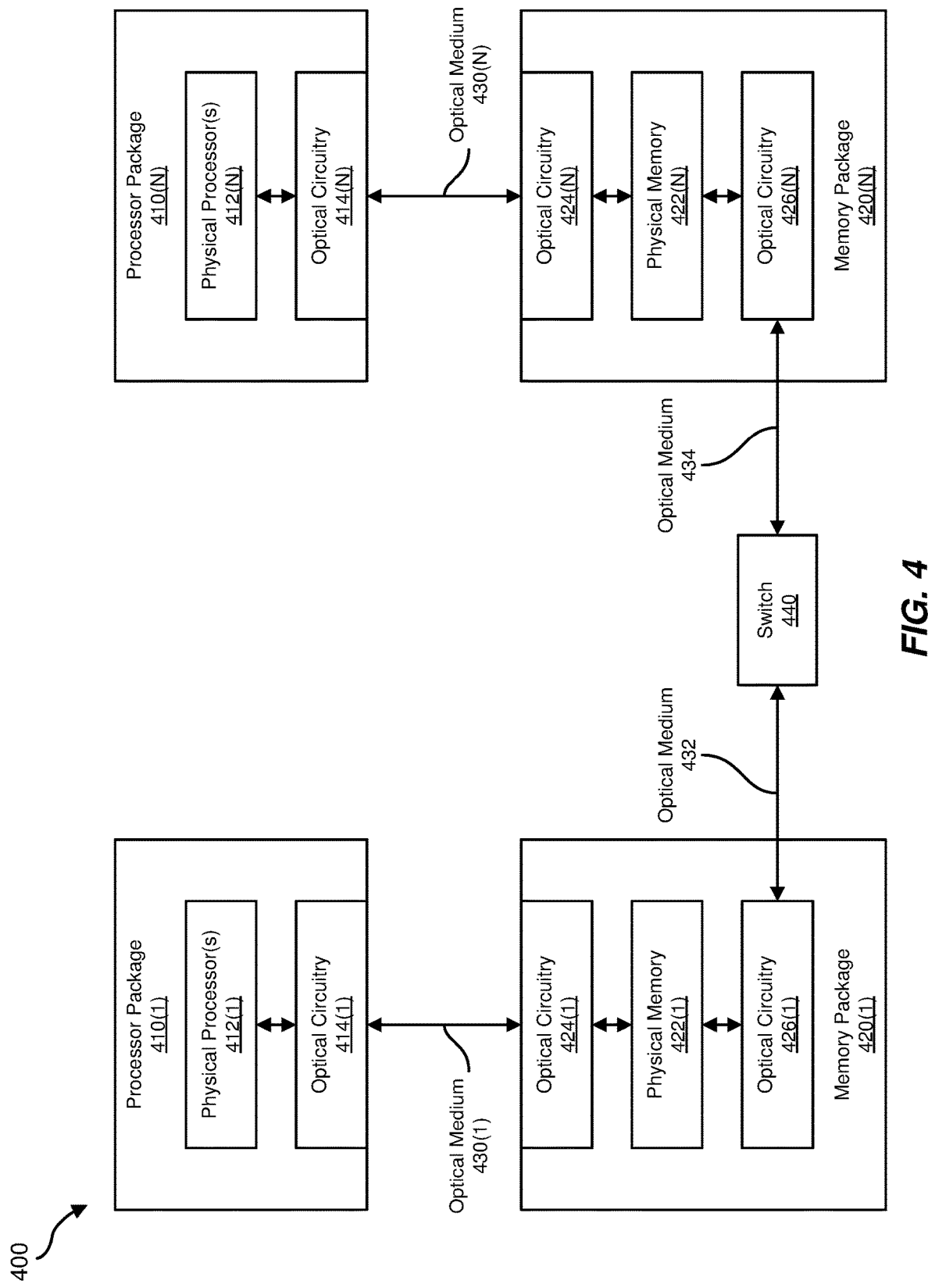
FIG. 4 is a block diagram of an exemplary disaggregated computing system having multiple processor packages and multiple memory packages optically coupled by optical media.

FIG. 4 illustrates an exemplary shared-memory system 400 that includes multiple processor packages 410(1)-(N) and multiple memory packages 420(1)-(N). As shown, each of optical media 430(1)-(N) may couple one of processor packages 410(1)-(N) to a corresponding one of memory packages 420(1)-(N). In this example, each of processor packages 410(1)-(N) may include one or more physical processor(s) 412 electrically or optically coupled to co-packaged optical circuitry 414, and each of memory packages 420(1)-(N) may include a physical memory 422 electrically or optically coupled to co-packaged optical circuitry 424. In this embodiment, each of memory packages 420(1)-(N) may include additional co-packaged optical circuitry 426 capable of communicatively coupling memory packages 420(1)-(N) with one another either directly or via optical media 432 and 434 and a switch 440, as shown. In some examples, system 400 may enable an end user to easily scale and/or reconfigure system 400 to suit the end user's individual compute and memory requirements by incorporating additional and/or different processor and/or memory packages into system 400 (e.g., to obtain an arbitrary ratio of compute and memory resources).

Figure 5:
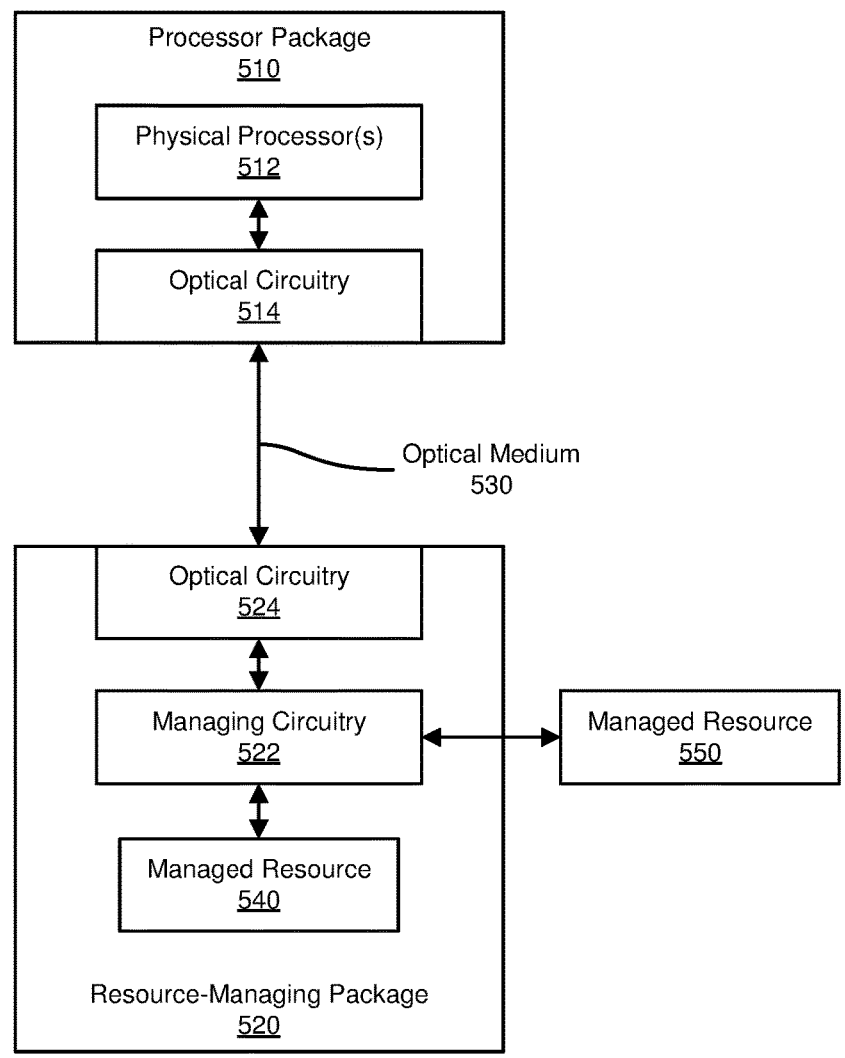
FIG. 5 is a block diagram of an exemplary disaggregated computing system having a processor package and a resource-managing package optically coupled by an optical medium.

FIG. 5 illustrates an exemplary system 500 that includes a processor package 510 and a resource-managing package 520 coupled by an optical medium 530. As shown, processor package 510 may include one or more physical processor(s) 512 electrically or optically coupled to co-packaged optical circuitry 514, and resource-managing package 520 may include managing circuitry 522 electrically or optically coupled to co-packaged optical circuitry 524. In some embodiments, managing circuitry 522 may be electrically or optically coupled to a co-packaged managed resource 540 and/or an external managed resource 550.

As used herein, the term "resource-managing circuitry" may refer to any type or form of functional circuitry capable of controlling a managed resource and/or facilitating access to the managed resource. Examples of resource managing circuitry include, without limitation, memory controllers capable of managing physical memory (e.g., a DRAM controller), storage controllers capable of managing storage resources, graphics controllers, Input/Output (I/O) controllers, expansion-bus controllers (e.g., a PCI Express (PCIe) root complex), northbridge circuitry, host-bridge circuitry, southbridge circuitry, variations or combinations of one or more of the same, or any other circuitry useful in facilitating data transfer to and/or from attached resources. In some embodiments, the disclosed resource-managing circuitry may control Double Data Rate (DDR) buses (e.g., Low Power DDR buses), Serial ATA (SATA) buses, Serial Attached SCSI (SAS) buses, High Bandwidth Memory (HBM) buses, Peripheral Component Interconnect Express (PCIe) buses, and the like.

Figure 6:
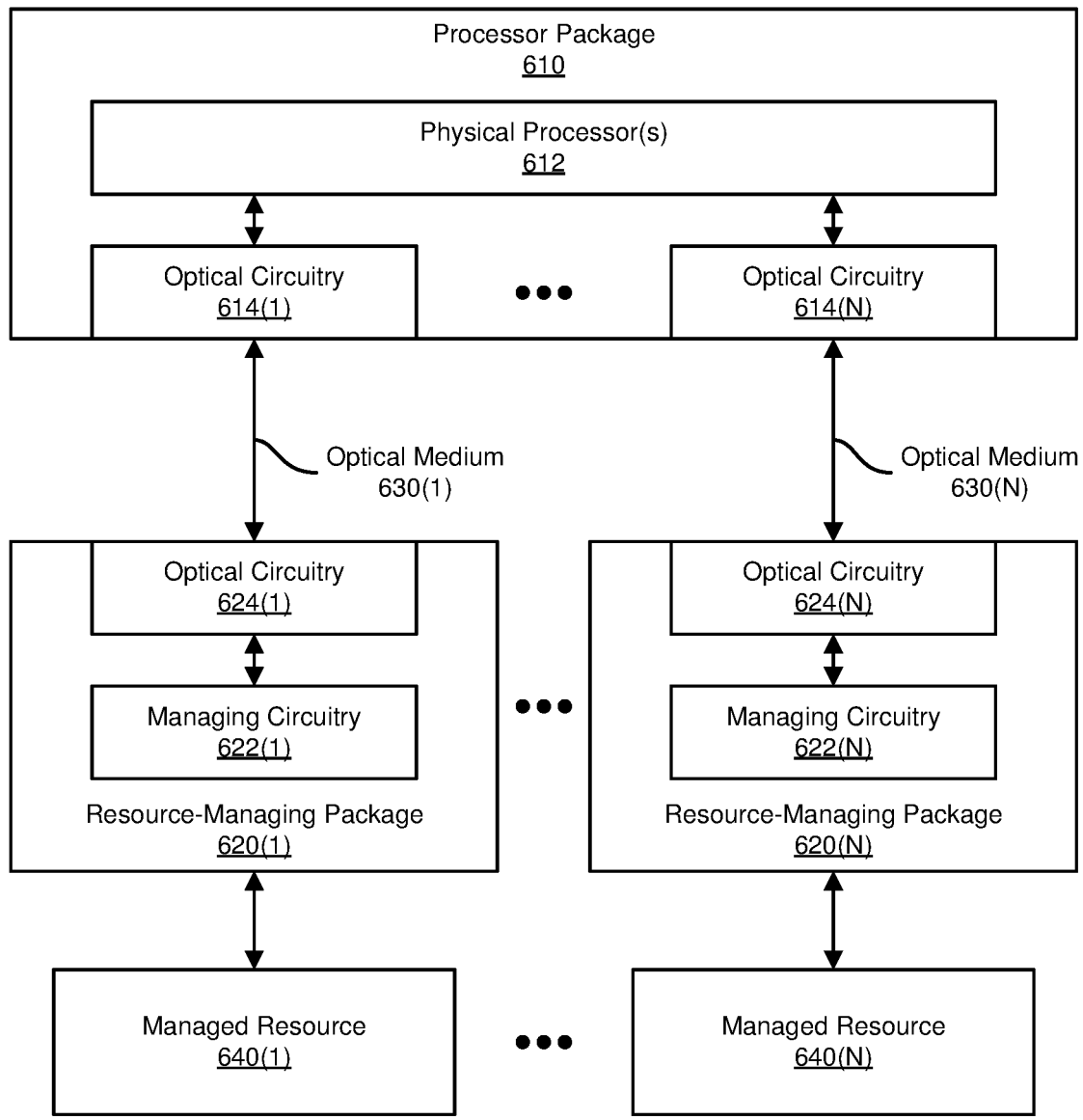
FIG. 6 is a block diagram of an exemplary disaggregated computing system having a processor package optically coupled to multiple resource-managing packages by optical media.
Figure 9:
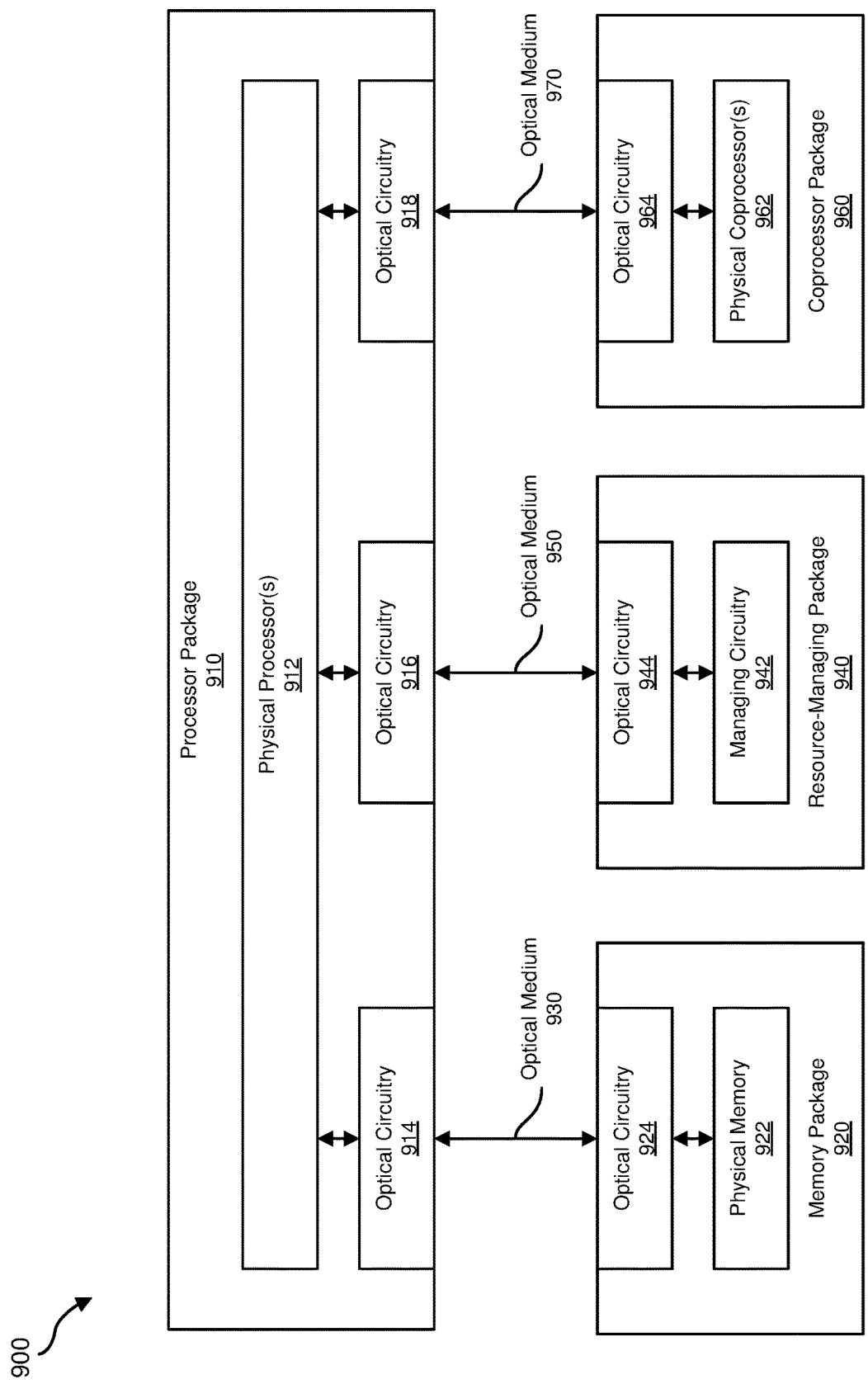
FIG. 9 is a block diagram of an exemplary disaggregated computing system having a processor package optically coupled to a memory package, a resource-managing package, and a coprocessor package by optical media.

In some embodiments, the disclosed physical processor(s) may access and/or utilize multiple and/or varied resources. FIG. 6 illustrates an exemplary system 600 that includes a processor package 610 coupled to multiple resource-managing packages 620(1)-(N) by optical media 630(1)-(N). As shown, processor package 610 may include one or more physical processor(s) 612 electrically or optically coupled to co-packaged optical circuitries 614(1)-(N), and each of resource-managing packages 620(1)-(N) may include managing circuitry 622 electrically or optically coupled to co-packaged optical circuitry 624 and a managed resource 640. In some embodiments, managed resources 640(1)-(N) may represent or include the same or similar types of resources, and managing circuitry 622(1)-(N) may represent or include the same or similar types of managing circuitry. For example, managed resources 640(1)-(N) may each be DRAM, and managing circuitry 622(1)-(N) may each include a DRAM controller. In other embodiments, some or all of managed resources 640(1)-(N) may represent or include different types of resources, and managing circuitry 622(1)-(N) may represent or include different types of managing circuitry (e.g., as illustrated in FIG. 9).

Figure 7:
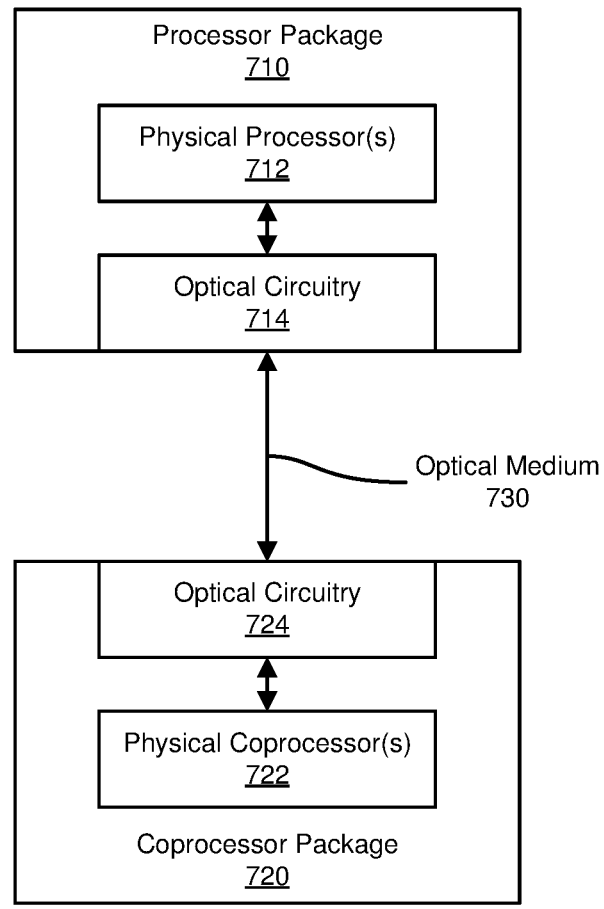
FIG. 7 is a block diagram of an exemplary disaggregated computing system having a processor package and a coprocessor package optically coupled by an optical medium.

FIG. 7 illustrates an exemplary system 700 that includes a processor package 710 and a coprocessor package 720 coupled by an optical medium 730. As shown, processor package 710 may include one or more physical processor(s) 712 electrically or optically coupled to co-packaged optical circuitry 714, and coprocessor package 720 may include one or more physical coprocessors 722 electrically or optically coupled to co-packaged optical circuitry 724.

As used herein, the term "coprocessor" may refer to any type or form of hardware-implemented coprocessing unit used to supplement the functions and operations of a primary processor. Examples of coprocessors include, without limitation, I/O coprocessors, math coprocessors, scalar coprocessors for performing scalar operations, matrix coprocessors for performing matrix operations, Single Instruction, Multiple Data (SIMD) coprocessors, Floating-Point coprocessors, Floating-Point Units (FPUs), cryptographic units, GPUs, DSPs, Network Processing Units (NPUs), speech and handwriting-recognition coprocessors, facial-recognition coprocessors, video coprocessors, audio coprocessors, multimedia coprocessors, natural-language processors, video transcoders, image-recognition engines, encoding/decoding engines, compression/decompression engines, vision processing units, AL engines, ML engines, neural engines, encryption/decryption engines, Trusted Platform Modules (TPMs), sensor hubs, motion coprocessors, variations or combinations of one or more of the same, or any other suitable supplemental coprocessing IC.

Figure 8:
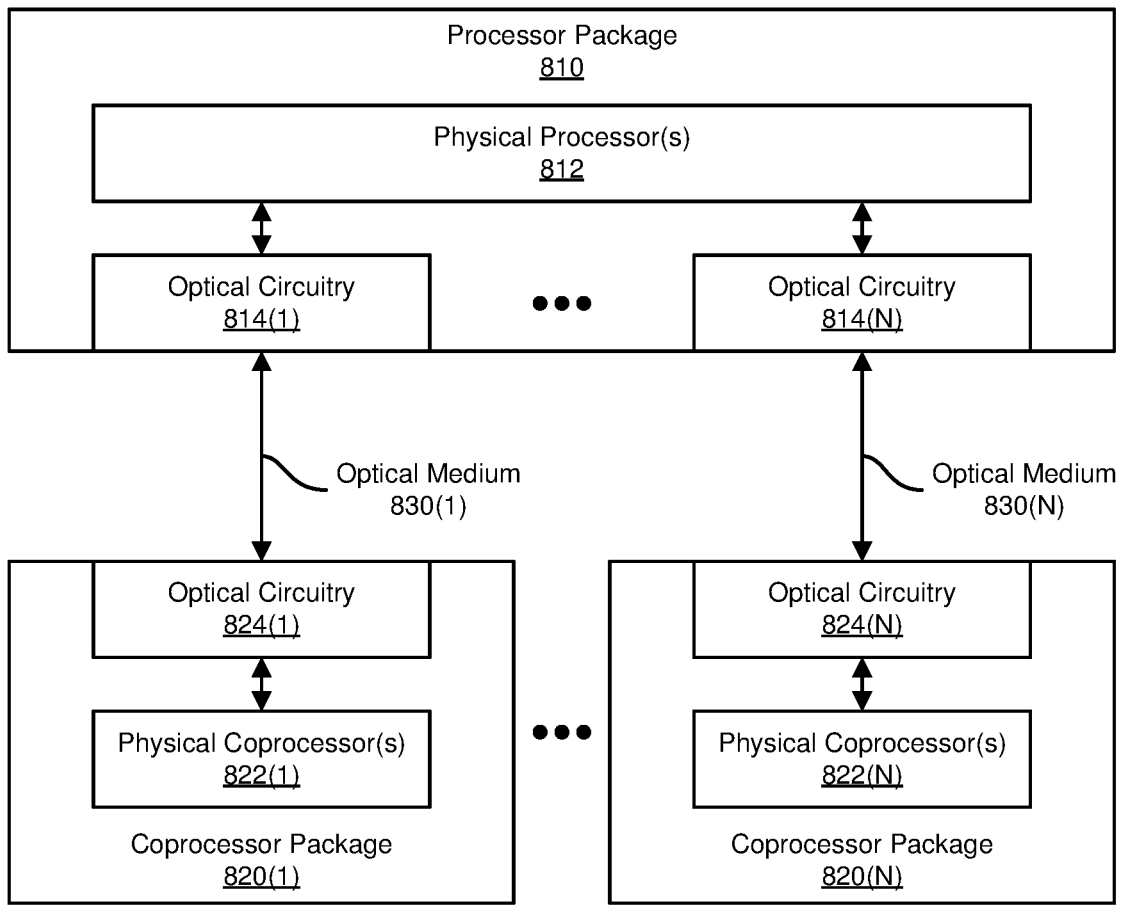
FIG. 8 is a block diagram of an exemplary disaggregated computing system having a processor package optically coupled to multiple coprocessor packages by optical media.

FIG. 8 illustrates an exemplary disaggregated computing system 800 that includes a processor package 810 coupled to multiple coprocessor packages 820(1)-(N) by optical media 830(1)-(N). As shown, each of optical media 830(1)-(N) may couple one of coprocessor packages 820(1)-(N) to processor package 810. In this example, processor package 810 may include one or more physical processor(s) 812 each being electrically or optically coupled to optical circuitries 814(1)-(N), and each of coprocessor packages 820(1)-(N) may include a physical coprocessor 822 electrically or optically coupled to co-packaged optical circuitry 824. In some examples, system 800 may enable an end user to easily scale and/or reconfigure system 800 to suit the end user's individual requirements by coupling additional and/or different coprocessor packages to processor package 810.

FIG. 9 illustrates an exemplary system 900 that includes a processor package 910 coupled to a memory package 920, a resource-managing package 940, and a coprocessor package 960 by optical medium 930, 950, and 970, respectively. As shown, processor package 910 may include one or more physical processor(s) 912 electrically or optically coupled to co-packaged optical circuitries 914, 916, and 918, memory package 920 may include physical memory 922 electrically or optically coupled to co-packaged optical circuitry 924, resource-managing package 940 may include managing circuitry 942 electrically or optically coupled to co-packaged optical circuitry 944 and a managed resource (not shown), and coprocessor package 960 may include one or more physical coprocessors 962 electrically or optically coupled to co-packaged optical circuitry 964. In some examples, system 900 may enable an end user to easily scale and/or reconfigure system 900 to suit the end user's individual requirements by coupling additional and/or different memory, resource-managing, and/or coprocessing packages to processor package 910.

Figure 10:
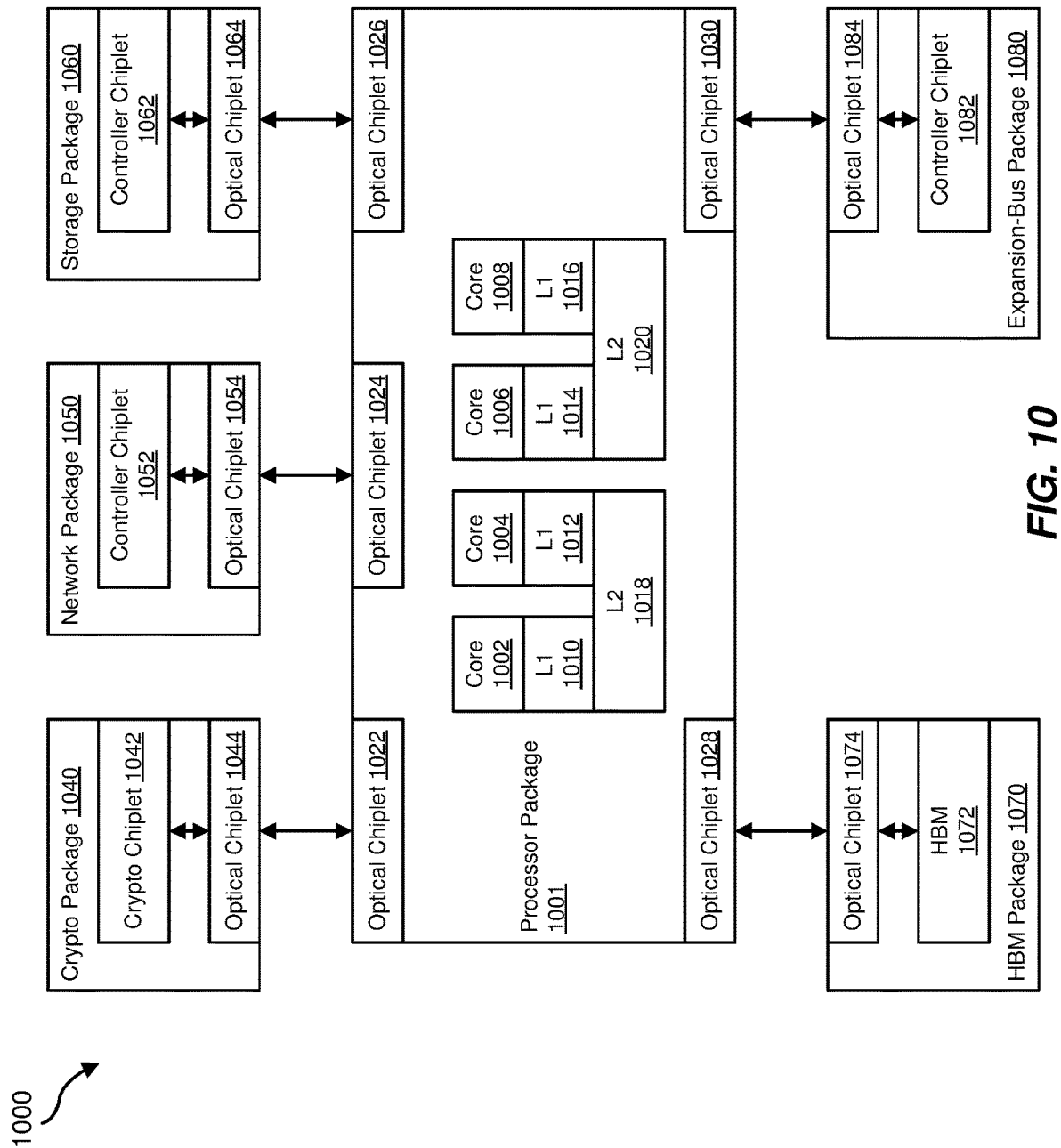
FIG. 10 is a block diagram of an exemplary disaggregated computing system having a processor package optically coupled to multiple disaggregated packages by optical media.

FIG. 10 illustrates an exemplary system 1000 having a processor package 1001 optically coupled to multiple disaggregated off-package components via multiple optical chiplets. As shown, processor package 1001 may include multiple processor cores (e.g., a core 1002, a core 1004, a core 1006, and a core 1008) each with access to multiple levels of cache memory. In this example, core 1002 may have sole access to a level-1 cache 1010 and shared access to a level-2 cache 1018, core 1004 may have sole access to a level-1 cache 1012 and shared access to level-2 cache 1018, core 1006 may have sole access to a level-1 cache 1014 and shared access to a level-2 cache 1020, and core 1008 may have sole access to a level-1 cache 1016 and shared access to level-2 cache 1020.

In some embodiments, some or all of cores 1002-1008 may be electrically or optically coupled within processor package 1001 to one or more of optical chiplets 1022, 1024, 1026, 1028, and 1030 through which the cores may access and/or communicate with a cryptographic package 1040 having a cryptographic chiplet 1042 electrically or optically coupled to a co-packaged optical chiplet 1044, a network package 1050 having a network controller chiplet 1052 electrically or optically coupled to a co-packaged optical chiplet 1054, a storage package 1060 having a storage controller chiplet 1062 electrically or optically coupled to a co-packaged optical chiplet 1064, an HBM package 1070 having on-package HBM 1072 electrically or optically coupled to a co-packaged optical chiplet 1074, and an expansion-bus package 1080 having an expansion-bus controller chiplet 1082 electrically or optically coupled to a co-packaged optical chiplet 1084.

Figure 11:
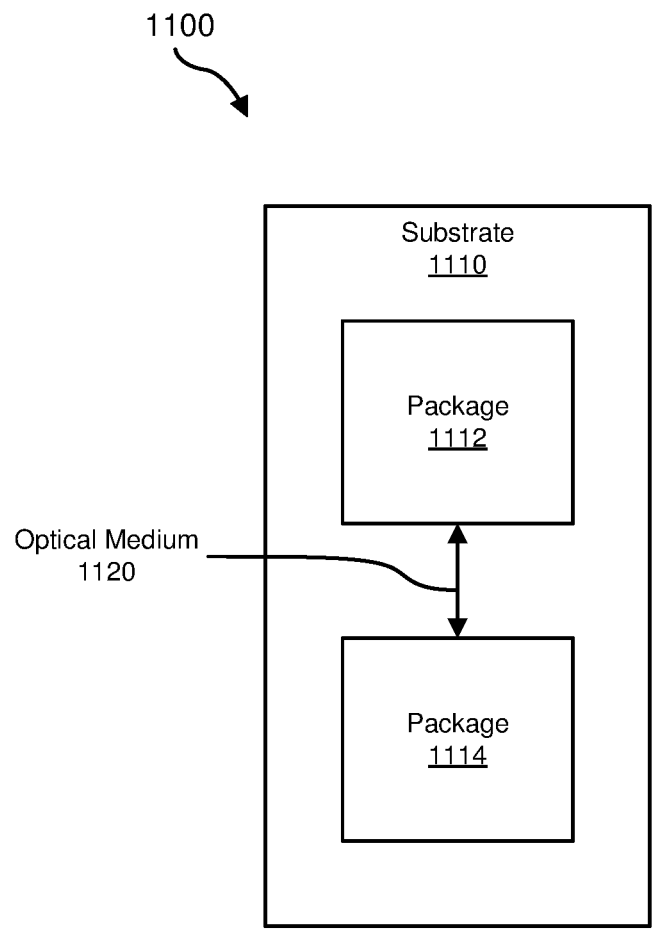
FIG. 11 is an illustration of exemplary packages coupled to a substrate.

FIG. 11 is an illustration of an exemplary system 1100 that includes a substrate 1110 (e.g., a printed circuit board) to which multiple disaggregated packages may be electrically, mechanically, and/or optically coupled. As shown, system 1100 may include a package 1112 and a package 1114, both mounted to substrate 1110. In this example, an optical medium 1120 may communicatively couple packages 1112 and 1114, which may represent any combination of the packages described in connection with FIGS. 1-10. In some embodiments, optical medium 1120 may include and/or represent an optical medium disposed on, along, and/or through substrate 1110. Additionally or alternatively, optical medium 1120 may include and/or represent a fiber-optic cable permanently or detachably coupled to co-packaged optical circuitry of packages 1112 and 1114. The packages illustrated in FIG. 11 may be distributed across substrate 1100 in any suitable manner. In some embodiments, packages 1112 and 1114 may be distributed based on power and/or thermal considerations. In at least one embodiment, one or more of packages 1112 and 1114 may be coupled to a cooling subsystem (e.g., including one or more heat sinks, heat pipes, fans, water blocks, etc.) particularly suited for the thermal profiles of the subcomponents contained therein.

Figure 12:
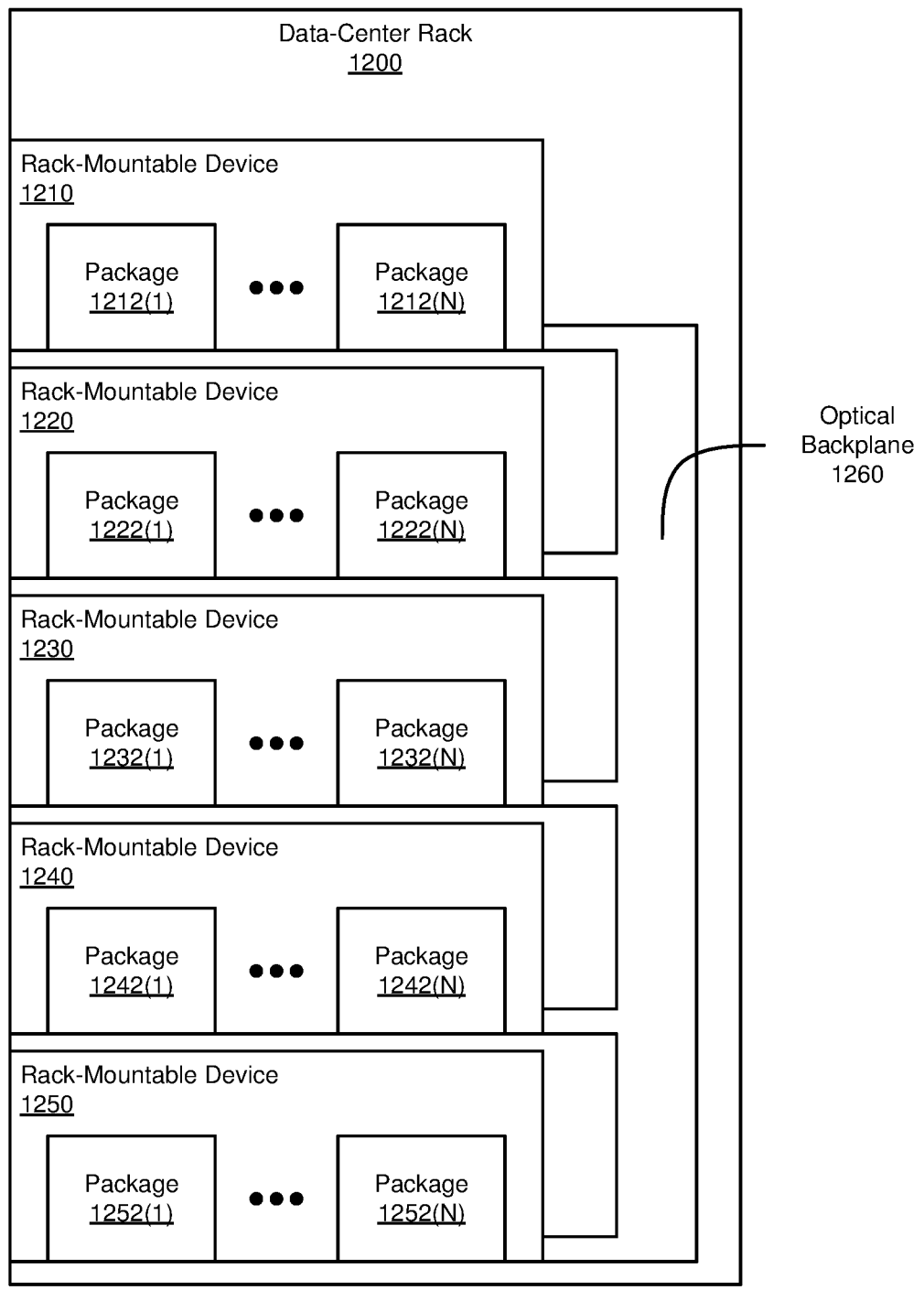
FIG. 12 is a block diagram of an exemplary data-center rack having multiple rack-mountable devices.

FIG. 12 illustrates an exemplary data-center rack 1200 that includes multiple rack-mountable devices 1210, 1220, 1230, 1240, and 1250 and an optical backplane 1260 that optically couples rack-mountable devices 1210-1250. As shown, rack-mountable devices 1210, 1220, 1230, 1240, and 1250 may respectively include one or more packages 1212 (1)-(N), one or more packages 1222(1)-(N), one or more packages 1232(1)-(N), one or more packages 1242(1)-(N), and one or more packages 1252(1)-(N), which may represent any combination of the packages described in connection with FIGS. 1-10. In some embodiments, some or all of rack-mounted devices 1210-1250 may include cooling and/or power subsystems particularly suited for the thermal and power profiles of the packages contained therein.

In some embodiments, one or more of rack-mountable devices 1210, 1220, 1230, 1240, and 1250 may include a single type of disaggregated package. For example, rack-mountable device 1210 may include processor packages, rack-mountable device 1220 may include HBM packages, rack-mountable device 1230 may include SRAM packages, rack-mountable device 1240 may include DRAM packages, and/or rack-mountable device 1250 may include coprocessor packages. In this example, some or all of these disaggregated packages may be optically interconnected via optical backplane 1260. In some examples, system 1200 may enable an end user to easily scale and/or reconfigure system 1200 to suit the end user's individual requirements by replacing or reconfiguring one or more of rack-mountable devices 1210-1250. For example, an end user needing additional HBM may simply add as many HBM containing rack-mountable devices to data-center rack 1200 as satisfies the need. Similarly, an end user needing a particular amount of cache memory may simply couple as many cache containing rack-mountable devices to data-center rack 1200 as satisfies the need.

Figure 13:
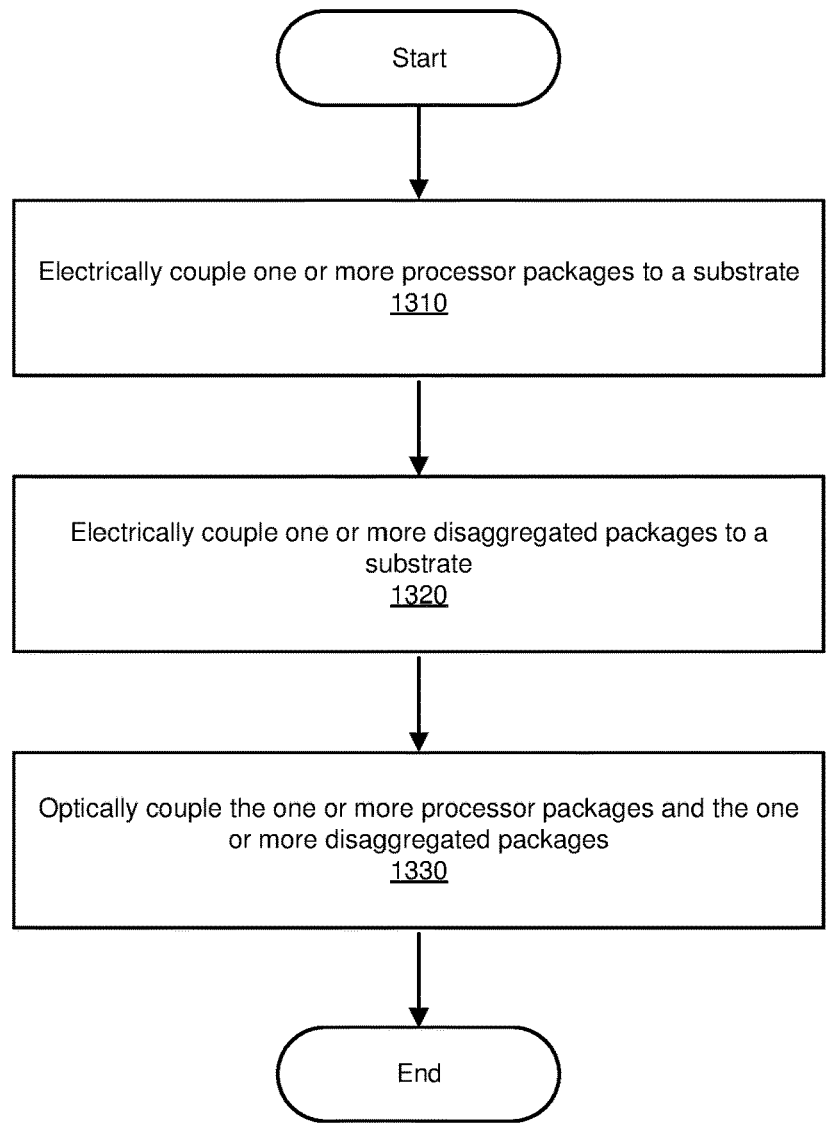
FIG. 13 is a flow diagram of an exemplary method for utilizing disaggregated packages in computing and memory systems.

FIG. 13 is a flow diagram of an exemplary method for utilizing disaggregated components in computing and memory systems. As shown, method 1300 may include a step 1310 of electrically coupling a processor package to a substrate. Step 1310 may be performed in a variety of ways, including any of those described above in connection with FIGS. 1-12. For example, a computing equipment manufacturer or subcontractor may electrically couple a processor package to a substrate such that the substrate provides electrical continuity between electrical contacts contained within the substrate and the processor package. In one example, the computing equipment manufacturer or subcontractor may form and/or achieve this electrical coupling by soldering and/or reflow processes.

Method 1300 may also include a step 1320 of electrically coupling a disaggregated package to a substrate. Step 1320 may be performed in a variety of ways, including any of those described above in connection with FIGS. 1-12. For example, a computing equipment manufacturer or subcontractor may electrically couple a memory package to the same substrate that contains the processor package of step 1310. Alternatively, a computing equipment manufacturer or subcontractor may electrically couple multiple memory packages to a substrate that contains no processor packages. In some examples, a computing equipment manufacturer or subcontractor may electrically couple a disaggregated package to a substrate such that the substrate provides electrical continuity between electrical contacts contained within the substrate and the disaggregated package. In one example, the computing equipment manufacturer or subcontractor may form and/or achieve this electrical coupling by soldering and/or reflow processes.

Method 1300 may also include a step 1330 of optically coupling the processor package and the disaggregated package. Step 1330 may be performed in a variety of ways, including any of those described above in connection with FIGS. 1-12. For example, the computing equipment manufacturer or subcontractor may optically couple a cable assembly to a corresponding optical interface of each of the processor package and the disaggregated package. In some examples, the computing equipment manufacturer or subcontractor may mechanically couple a processor package and a disaggregated package to a substrate such that the substrate provides optical continuity between optical interfaces contained within the substrate and each of the processor package and the disaggregated package. In at least one example, the computing equipment manufacturer or subcontractor may perform step 1330 in conjunction with steps 1310 and 1320.

EXAMPLE EMBODIMENTS

Example 1

A system may include (1) a memory package having a physical memory and optical circuitry, (2) a processor package, separate and distinct from the memory package, having at least one physical processor and additional optical circuitry, and (3) an optical medium communicatively coupling the optical circuitry of the memory package with the additional optical circuitry of the processor package.

Example 2

The system of Example 1, wherein (1) the optical circuitry forms a part of an optical chiplet electrically coupled to the physical memory and (2) the additional optical circuitry forms a part of an additional optical chiplet electrically coupled to the physical processor.

Example 3

The system of any of Examples 1-2, wherein (1) the physical memory and the optical circuitry form parts of a die and (2) the physical processor and the additional optical circuitry form parts of an additional die.

Example 4

The system of any of Examples 1-3, wherein the physical memory includes high bandwidth memory.

Example 5

The system of any of Examples 1-4, further including (1) an additional memory package, separate and distinct from the memory package and the processor package, having at least one additional physical memory and additional optical circuitry and (2) an additional optical medium communicatively coupling the optical circuitry of the memory package with the additional optical circuitry of the additional memory package.

Example 6

The system of any of Examples 1-5, further including (1) an additional processor package, separate and distinct from the memory package and the processor package, having at least one additional physical processor and additional optical circuitry and (2) an additional optical medium communicatively coupling the optical circuitry of the memory package with the additional optical circuitry of the additional processor package.

Example 7

The system of any of Examples 1-6, wherein (1) the physical memory includes a cache memory and (2) the physical processor comprises a central processing unit.

Example 8

The system of any of Examples 1-7, wherein the cache memory comprises a static random-access memory.

Example 9

The system of any of Examples 1-8, further including a substrate. In this example, the memory package may be electrically coupled to the substrate at a first location, and the processor package may be electrically coupled to the substrate at a second location.

Example 10

The system of any of Examples 1-9, further including (1) a first rack-mountable chassis and (2) a second rack-mountable chassis. In this example, the memory package may be located in the first rack-mountable chassis, and the processor package may be located in the second rack-mountable chassis.

Example 11

The system of any of Examples 1-10, further including an optical backplane extending from the first rack-mountable chassis to the second rack-mountable chassis. In this example, the optical backplane may include the optical medium.

Example 12

A system including (1) a processor package having at least one physical processor and optical circuitry, (2) a resource-managing package, separate and distinct from the processor package, having resource-managing circuitry adapted to manage the physical processor's access to a computer resource and additional optical circuitry, and (3) an optical medium communicatively coupling the optical circuitry of the processor package with the additional optical circuitry of the resource-managing package.

Example 13

The system of Example 12, wherein the resource-managing circuitry is adapted to manage the physical processor's access to physical storage.

Example 14

The system of any of Examples 12-13, wherein the resource-managing circuitry is adapted to manage the physical processor's access to physical memory.

Example 15

The system of any of Examples 12-14, wherein the resource-managing circuitry is adapted to manage the physical processor's access to a network.

Example 16

The system of any of Examples 12-15, wherein the resource-managing circuitry is adapted to manage the physical processor's access to an expansion bus.

Example 17

The system of any of Examples 12-16, wherein the resource-managing circuitry is a physical coprocessor adapted to perform one or more cryptographic operations.

Example 18

The system of any of Examples 12-17, wherein the resource-managing circuitry is a physical coprocessor adapted to perform one or more single instruction, multiple data operations.

Example 19

The system of any of Examples 12-18, wherein the resource-managing circuitry is a floating-point coprocessor adapted to perform operations on floating-point numbers.

Example 20

A system including (1) a memory package having a physical memory and first optical circuitry, (2) a processor package, separate and distinct from the memory package, having at least one physical processor, second optical circuitry, and third optical circuitry, (3) a coprocessor package, separate and distinct from the memory package and the processor package, having at least one physical coprocessor and fourth optical circuitry, (4) an optical medium communicatively coupling the first optical circuitry of the memory package with the second optical circuitry of the processor package, and (5) an additional optical medium communicatively coupling the third optical circuitry of the processor package with the fourth optical circuitry of the coprocessor package.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A system comprising:
a memory package comprising:
a physical memory; and
first optical circuitry;
a processor package, separate and distinct from the memory package, comprising:
at least one physical processor; and
second optical circuitry;
an optical medium communicatively coupling the first optical circuitry of the memory package with the second optical circuitry of the processor package;
a resource-managing package, separate and distinct from the memory package and the processor package, comprising:
a computer resource comprising one of:
a cryptographic unit;
a network interface;
an expansion-bus interface; or
a storage-device interface;
resource-managing circuitry adapted to manage the physical processor's access to the computer resource; and
third optical circuitry; and
an additional optical medium communicatively coupling the second optical circuitry of the processor package with the third optical circuitry of the resource-managing package.

2. The system of claim 1, wherein:
the first optical circuitry forms a part of a first optical chiplet electrically coupled to the physical memory;
the second optical circuitry forms a part of a second optical chiplet electrically coupled to the physical processor; and
the third optical circuitry forms a part of a third optical chiplet electrically coupled to the resource-managing circuitry.

3. The system of claim 1, wherein:
the physical memory and the first optical circuitry form parts of a first die;
the physical processor and the second optical circuitry form parts of a second die; and
the resource-managing circuitry and the third optical circuitry form parts of a third die.

4. The system of claim 1, wherein the physical memory comprises high bandwidth memory.

5. The system of claim 1, further comprising a substrate, wherein:
the memory package is electrically coupled to the substrate at a first location;
the processor package is electrically coupled to the substrate at a second location; and
the resource-managing package is electrically coupled to the substrate at a third location.

6. The system of claim 1, further comprising:
a first rack-mountable chassis;
a second rack-mountable chassis; and
a third rack-mountable chassis, wherein:
the memory package is located in the first rack-mountable chassis;
the processor package is located in the second rack-mountable chassis; and
and the resource-managing package is located in the third rack-mountable chassis.

7. The system of claim 6, further comprising an optical backplane optically coupling the first rack-mountable chassis, the second rack-mountable chassis, and the third rack-mountable chassis wherein the optical backplane comprises the optical medium and the additional optical medium.

8. The system of claim 1, wherein:
the computer resource comprises the storage-device interface coupled to a physical storage device; and
the resource-managing circuitry is adapted to manage the physical processor's access to the physical storage device coupled to the storage-device interface.

9. The system of claim 1, wherein:
the computer resource comprises the network interface coupled to a network; and
the resource-managing circuitry is adapted to manage the physical processor's access to the network.

10. The system of claim 1, wherein:
the computer resource comprises the expansion-bus interface coupled to an expansion bus; and
the resource-managing circuitry is adapted to manage the physical processor's access to the expansion bus coupled to the expansion-bus interface.

11. The system of claim 1, wherein the computer resource comprises the cryptographic unit adapted to perform one or more cryptographic operations for the physical processor.

12. A system comprising:
a processor package comprising:
at least one physical processor; and
optical circuitry;
a resource-managing package, separate and distinct from the processor package, comprising:
a computer resource comprising one of:
a cryptographic unit;
a network interface;
an expansion-bus interface; or
a storage-device interface;
resource-managing circuitry adapted to manage the physical processor's access to the computer resource; and
additional optical circuitry; and
an optical medium communicatively coupling the optical circuitry of the processor package with the additional optical circuitry of the resource-managing package.

13. The system of claim 12, wherein:
the computer resource comprises the storage-device interface coupled to a physical storage device; and
the resource-managing circuitry is adapted to manage the physical processor's access to the physical storage device coupled to the storage-device interface.

14. The system of claim 12, wherein:
the computer resource comprises the network interface coupled to a network; and
the resource-managing circuitry is adapted to manage the physical processor's access to the network.

15. The system of claim 12, wherein:
the computer resource comprises the expansion-bus interface coupled to an expansion bus; and
the resource-managing circuitry is adapted to manage the physical processor's access to the expansion bus coupled to the expansion-bus interface.

16. The system of claim 12, wherein the computer resource comprises the cryptographic unit adapted to perform one or more cryptographic operations for the physical processor.

17. A system comprising:
a memory package comprising:
a physical memory; and
first optical circuitry;
a processor package, separate and distinct from the memory package, comprising:

at least one physical processor;
second optical circuitry; and
third optical circuitry;
a coprocessor package, separate and distinct from the memory package and the processor package, comprising:
at least one physical coprocessor comprising one of:
a Single Instruction, Multiple Data (SIMD) unit;
a Floating-Point Unit (FPU);
a speech-recognition coprocessor;
an encryption engine;
an artificial-intelligence engine; or
a Trusted Platform Module (TPM); and
fourth optical circuitry;
an optical medium communicatively coupling the first optical circuitry of the memory package with the second optical circuitry of the processor package; and
an additional optical medium communicatively coupling the third optical circuitry of the processor package with the fourth optical circuitry of the coprocessor package.

18. The system of claim 17, wherein the physical coprocessor comprises the SIMD unit adapted to perform one or more single instruction, multiple data operations for the physical processor.

19. The system of claim 17, wherein the physical coprocessor comprises the FPU adapted to perform operations on floating-point numbers.

20. The system of claim 17, wherein the physical coprocessor comprises the artificial-intelligence engine adapted to perform one or more artificial-intelligence operations for the physical processor.

* * * * *